United States Patent
Tsai et al.

(10) Patent No.: US 6,904,587 B2
(45) Date of Patent: Jun. 7, 2005

(54) INCREMENTAL LITHOGRAPHY MASK LAYOUT DESIGN AND VERIFICATION

(75) Inventors: Chi-Ming Tsai, Palo Alto, CA (US); Chin-Hsen Lin, Fremont, CA (US); Yao-Ting Wang, Atherton, CA (US)

(73) Assignee: Synopsys, Inc., Mountain View, CA (US)

(*) Notice: Subject to any disclaimer, the term of this patent is extended or adjusted under 35 U.S.C. 154(b) by 87 days.

(21) Appl. No.: 10/327,446

(22) Filed: Dec. 20, 2002

(65) Prior Publication Data

US 2004/0123264 A1 Jun. 24, 2004

(51) Int. Cl.$^7$ .............................................. G06F 17/50
(52) U.S. Cl. ........................ 716/19; 716/21; 716/4; 430/5
(58) Field of Search .......................... 716/19–21, 4; 430/5

(56) References Cited

U.S. PATENT DOCUMENTS

| | | | |
|---|---|---|---|
| 6,493,865 B2 * | 12/2002 | Fischer et al. ................. | 716/19 |
| 6,553,558 B2 * | 4/2003 | Palmer et al. ................. | 716/19 |
| 6,578,190 B2 * | 6/2003 | Ferguson et al. .............. | 716/21 |
| 6,609,245 B2 * | 8/2003 | Liebmann et al. ............. | 716/21 |
| 2002/0166108 A1 * | 11/2002 | Rittman ....................... | 716/19 |

* cited by examiner

*Primary Examiner*—Vuthe Siek
(74) *Attorney, Agent, or Firm*—Bever, Hoffman & Harms LLP; Jeanette S. Harms

(57) ABSTRACT

A lithography mask layout is designed and verified incrementally to help reduce the amount of time to produce the mask layout. For one embodiment, a layout defining a target pattern may be processed to produce a mask layout, and the mask layout may be verified to identify errors. Rather than processing and verifying the entire mask layout for error correction over one or more subsequent iterations, sub-layouts having errors may be removed or copied from the mask layout for separate processing and verification. Because the amount of data defining a sub-layout is relatively small, the time to design and verify the mask layout is reduced. The resulting mask layout having one or more processed and verified sub-layout(s) may then be used to manufacture a mask set to help print the target pattern in manufacturing integrated circuits (ICs), for example.

23 Claims, 5 Drawing Sheets

INCREMENTAL LITHOGRAPHY MASK LAYOUT DESIGN AND VERIFICATION

BACKGROUND

1. Field of the Invention

The present invention relates generally to the field of lithography processing. More particularly, the present invention relates to the field of lithography mask layout design and verification.

2. Description of Related Art

The layout of a lithography mask set for use in manufacturing integrated circuits (ICs), for example, may be designed by processing a layout defining a target pattern to be printed using the mask set to help compensate for lithography distortions and/or to help reduce the size of features. Designing a mask layout in this manner may therefore help increase IC yield and/or help increase performance and reduce power consumption.

The layout defining the target pattern may be processed, for example, to introduce phase-shifting mask (PSM) regions in the mask layout to help define features with dimensions less than the wavelength of the radiation to be directed through the mask set in printing the mask layout. The layout defining the target pattern may also be processed, for example, to perform optical proximity correction (OPC) to compensate for nonlinear distortions caused by optical diffraction and resist process effects, for example. Performing OPC therefore helps produce a mask layout that will print a pattern that more accurately matches the target pattern. Examples of tools that enable the processing of layouts in this manner include iN-Phase® and iN-Tandem™, both of which are developed by Numerical Technologies, Inc. of San Jose, Calif.

The resulting mask layout may be verified by performing design rule checking (DRC) to identify minimum line and minimum space violation errors. The resulting mask layout may also be verified by simulating a print of the mask layout for comparison against the layout defining the target pattern and identifying any errors, such as out-of-tolerance regions for example, for correction. One example of a tool that enables the verification of mask layouts in this manner is SiVL® which is also developed by Numerical Technologies, Inc.

Errors are corrected by reprocessing the entire mask layout under a different set of parameters. The reprocessed mask layout may then be again verified to identify whether the errors have been corrected or whether any new errors have been generated. Reprocessing and verification iteratively continue in this manner until the mask layout does not have any errors. Errors in a mask layout may also be manually viewed and corrected.

Because the amount of data defining a mask layout rapidly grows in size as the mask layout is processed, the time to process and verify a mask layout over multiple iterations is relatively long. The time to open a file containing such a large amount of data for manual review and error correction is also relatively long. Opening such a large data file can also destabilize an operating system and possibly cause a software crash.

SUMMARY

Methods and apparatuses for incrementally designing and verifying a lithography mask layout are described. By designing and verifying a mask layout incrementally, that is by first processing a layout defining a target pattern to produce a mask layout and verifying the entire mask layout over an initial iteration and then processing and verifying sub-layouts having errors rather than the entire mask layout over one or more subsequent iterations, the time to produce the mask layout may be reduced. Also, files containing sub-layouts may be opened in reduced time for manual viewing and/or editing with reduced concern for operating system instability.

For one method, an error in a mask layout is identified. A sub-layout having the identified error is identified in the mask layout. The identified sub-layout is merged into the mask layout after the identified sub-layout has been processed to attempt to correct the identified error. In this manner, the time to process a mask layout for error correction may be reduced.

The processed sub-layout may be verified prior to or after merging the processed sub-layout into the mask layout. In this manner, the time to verify a mask layout may be reduced. For one embodiment, only a sub-layout of the identified sub-layout may be processed. For one embodiment, a sub-layout comprising the merged sub-layout in the mask layout may be verified.

A computer-readable medium having instructions which, when executed by a computer system, cause the computer system to perform the method is also described.

For another method, a mask layout is verified to identify one or more errors in the mask layout. One or more sub-layouts having one or more identified errors are identified in the mask layout. One or more identified sub-layouts are processed to attempt to correct one or more identified errors. One or more processed sub-layouts are verified. One or more processed sub-layouts are merged into the mask layout. For one embodiment, only a sub-layout of one or more identified sub-layouts may be processed. For one embodiment, one or more sub-layouts comprising a merged sub-layout in the mask layout may be verified. A computer-readable medium having instructions which, when executed by a computer system, cause the computer system to perform the method is also described.

One apparatus comprises a layout verification tool to identify an error in a mask layout. The apparatus also comprises a sub-layout identification tool to identify in the mask layout a sub-layout having the identified error and a layout merging tool to merge the identified sub-layout into the mask layout after the identified sub-layout has been processed to attempt to correct the identified error.

For one embodiment, the layout verification tool is to verify the processed sub-layout prior to the merging of the processed sub-layout into the mask layout. For one embodiment, the layout verification tool is to verify the processed sub-layout after the merging of the processed sub-layout into the mask layout. For one embodiment, the layout verification tool is to verify in the mask layout a sub-layout comprising the merged sub-layout.

Another apparatus comprises a mask layout processing tool to process an input layout to produce a mask layout and to process one or more sub-layouts to attempt to correct one or more errors, a layout verification tool to verify the mask layout to identify one or more errors in the mask layout and to verify one or more sub-layouts that have been processed by the mask layout processing tool, a sub-layout identification tool to identify in the mask layout one or more sub-layouts having one or more identified errors, and a layout merging tool to merge into the mask layout one or more identified sub-layouts that have been processed by the mask layout processing tool.

For one embodiment, the mask layout processing tool is to process only a sub-layout of one or more identified sub-layouts. For one embodiment, the layout verification tool is to verify in the mask layout one or more sub-layouts comprising a merged sub-layout.

Another apparatus comprises means for identifying an error in a mask layout, means for identifying in the mask layout a sub-layout having the identified error, and means for merging the identified sub-layout into the mask layout after the identified sub-layout has been processed to attempt to correct the identified error.

For one embodiment, the apparatus comprises means for processing the identified sub-layout. For one embodiment, the apparatus comprises means for verifying the processed sub-layout.

A mask is manufactured in accordance with a mask layout produced by processing an input layout to produce an initial mask layout, identifying an error in the initial mask layout, identifying in the initial mask layout a sub-layout having the identified error, processing the identified sub-layout to attempt to correct the identified error, and merging the processed sub-layout into the initial mask layout.

An integrated circuit is manufactured by printing a target pattern in a layer over a substrate using a mask set manufactured in accordance with a mask layout produced by processing an input layout to produce an initial mask layout, identifying an error in the initial mask layout, identifying in the initial mask layout a sub-layout having the identified error, processing the identified sub-layout to attempt to correct the identified error, and merging the processed sub-layout into the initial mask layout.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

The following detailed description sets forth an embodiment or embodiments in accordance with the present invention for incremental lithography mask layout design and verification. Embodiments of the invention include methods, apparatuses, systems, and computer-readable media having instructions for incrementally designing and verifying a lithography mask layout to help reduce the amount of time to produce the mask layout. Embodiments of the invention also include masks, mask sets, and integrated circuits manufactured using the produced mask layout.

An example portion of a layout defining a target pattern to be printed and an example portion of a mask layout produced by processing the layout defining the target pattern are first described with reference to FIGS. 1 and 2. Embodiments of the invention are then described, with reference to FIGS. 1, 2, 3, 4, and 5, in the context of a system that incrementally designs and verifies a mask layout. Embodiments of the invention are then described, with reference to FIG. 6, in the context of a system that uses an incrementally designed and verified mask layout to manufacture a mask set to help print a target pattern in manufacturing an integrated circuit (IC).

Incremental Mask Layout Design and Verification

Figure 1:
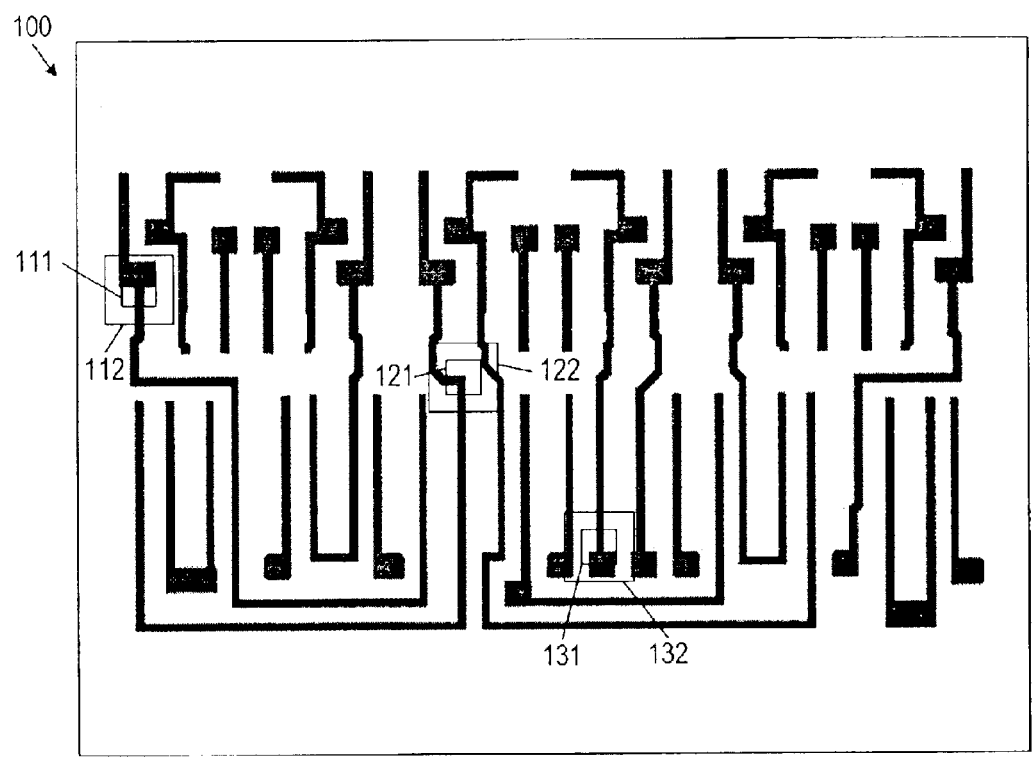
FIG. 1 illustrates, for one embodiment, an example portion of a layout defining a target pattern to be printed.

FIG. 1 illustrates, for one embodiment, an example portion of a layout 100 defining a target pattern to be printed in a layer over a substrate in manufacturing an integrated circuit (IC). Although described in the context of ICs, the present invention may be used to help print target patterns in manufacturing any suitable objects.

Figure 2:
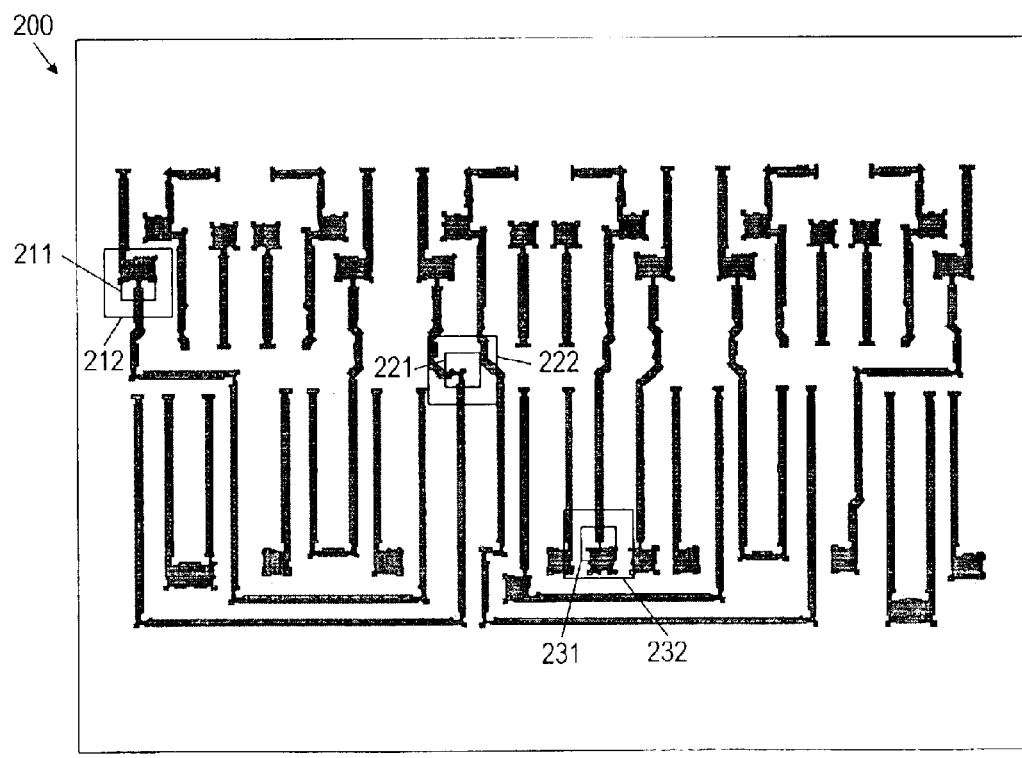
FIG. 2 illustrates, for one embodiment, an example portion of a lithography mask layout produced by processing the layout of FIG. 1.

FIG. 2 illustrates, for one embodiment, an example portion of a lithography mask layout 200 produced by processing layout 100 for use in manufacturing a mask set to help print the target pattern. Mask layout 200 has been verified to identify one or more errors, such as minimum line violations and/or out-of-tolerance regions for example, in mask layout 200.

Rather than processing all of mask layout 200 to correct identified error(s) and verifying all of mask layout 200 over one or more subsequent iterations, one or more sub-layouts having one or more identified errors, such as sub-layouts 211, 221, and 231 for example, may be identified in mask layout 200 for separate error correction processing and verification. Because the amount of data defining a sub-layout is relatively small as compared to the amount of data to define all of mask layout 200, the time to design and verify mask layout 200 is reduced because only one or more sub-layouts are processed for error correction and verified over one or more subsequent iterations. Also, a file containing a sub-layout may be opened in reduced time for manual review and/or error correction with reduced concern for system instability as compared to opening a file containing all of mask layout 200.

One or more processed sub-layouts may be merged into mask layout 200 either prior to or after verification of the processed sub-layout(s). The resulting mask layout 200 having one or more processed and verified sub-layout(s) may then be used to manufacture a mask set to help print the target pattern.

Figure 3:
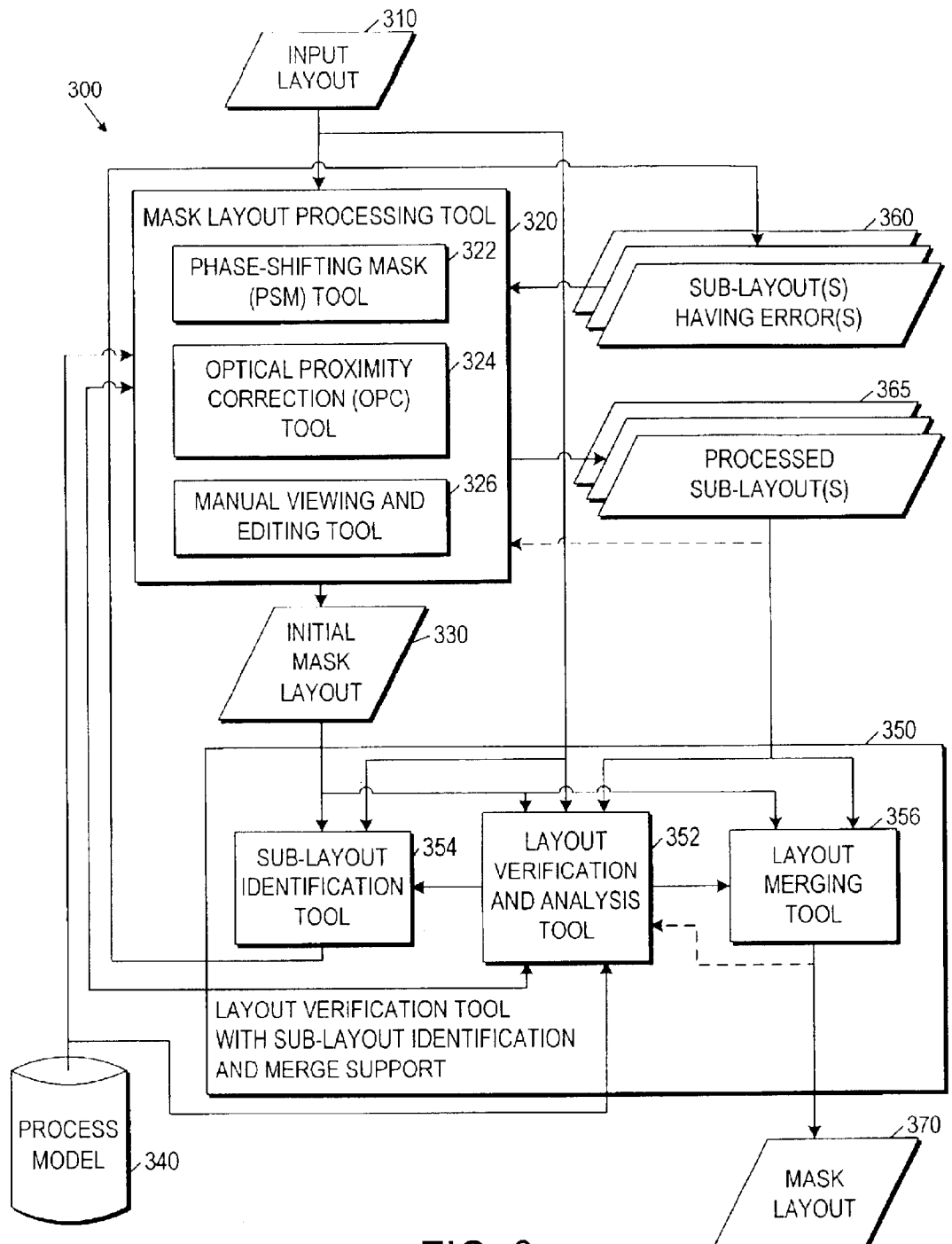
FIG. 3 illustrates, for one embodiment, a system to design and verify a lithography mask layout in an incremental manner.

FIG. 3 illustrates, for one embodiment, a system 300 to design and verify a mask layout in an incremental manner. As illustrated in FIG. 3, system 300 for one embodiment comprises a mask layout processing tool 320 and a layout verification tool 350 having support for sub-layout identification and merge. System 300 for one embodiment may incrementally design and verify a mask layout in accordance with a flow diagram 400 of FIG. 4.

Figure 4:
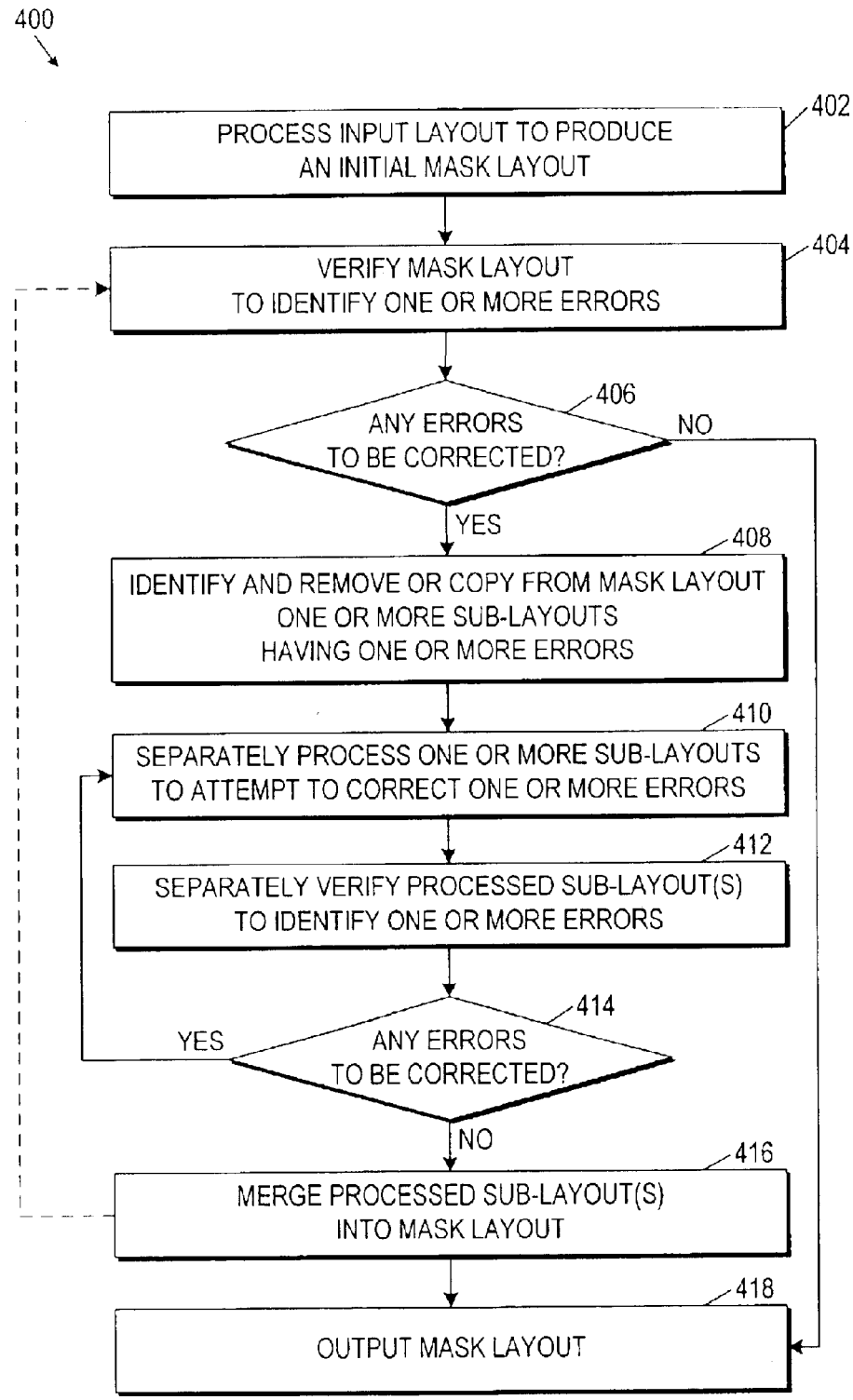
FIG. 4 illustrates, for one embodiment, a flow diagram to design and verify a lithography mask layout in an incremental manner.

For block 402 of FIG. 4, mask layout processing tool 320 processes an input layout 310 to produce an initial mask layout 330. Input layout 310 comprises data in a suitable format, such as GDS-II for example, to define a target pattern to be printed. Initial mask layout 330 comprises data in a suitable format, such as GDS-II for example, to define a mask pattern for one or more masks in a mask set to help print the target pattern defined by input layout 310.

Mask layout processing tool 320 may process input layout 310 in any suitable manner to produce initial mask layout 330. Mask layout processing tool 320 for one embodiment may use a lithography process model 340 to account for lithography process effects to be encountered in printing the target pattern. Mask layout processing tool 320 for one embodiment may comprise a phase-shifting mask (PSM) tool 322 to introduce PSM regions in initial mask layout 330 to help define features with dimensions less than the wavelength of the radiation to be directed through the mask set to help print the target pattern. Mask layout processing tool 320 for one embodiment may comprise an optical proximity correction (OPC) tool 324 to perform OPC by modifying input layout 310 to compensate for nonlinear distortions caused by optical diffraction and resist process effects, for example. Mask layout processing tool 320 for one embodiment may comprise a manual viewing and editing tool 326 to allow a user to manually view and/or edit a portion or all of a pattern defined by a layout.

For block 404 of FIG. 4, layout verification tool 350 verifies initial mask layout 330 to identify one or more errors. Layout verification tool 350 may verify initial mask layout 330 in any suitable manner to identify any suitable one or more types of errors.

As illustrated in FIG. 3, layout verification tool 350 for one embodiment may comprise a layout verification and analysis tool 352 to verify initial mask layout 330. Layout verification and analysis tool 352 for one embodiment may perform design rule checking (DRC) by verifying initial mask layout 330 against a set of manufacturing process rules to identify one or more suitable errors, such as minimum line violations and/or minimum space violations for example, in initial mask layout 330. In addition to or as an alternative to performing DRC, layout verification and analysis tool 352 for one embodiment may simulate the printing of initial mask layout 330 and compare the pattern resulting from the simulated print against the target pattern defined by input layout 310 to identify one or more suitable errors in initial mask layout 330. Suitable errors that may be identified using this technique include, for example, deviations in the simulated pattern that exceed tolerance limits, low contrast errors, and/or high susceptibility to amplify unavoidable mask errors beyond tolerance limits. Layout verification and analysis tool 352 for one embodiment may use process model 340 to simulate the printing of initial mask layout 330.

If any errors are identified in initial mask layout 330, as identified for block 406 of FIG. 4, layout verification tool 350 for block 408 identifies and either removes or copies from initial mask layout 330 one or more sub-layouts 360 having one or more identified errors. Layout verification tool 350 may identify in initial mask layout 330 any suitable sub-layout having an identified error in any suitable manner and may remove or copy one or more identified sub-layouts 360 having one or more identified errors from initial mask layout 330 in any suitable manner.

As illustrated in FIG. 3, layout verification tool 350 for one embodiment may comprise a sub-layout identification tool 354 to identify and either remove or copy one or more sub-layouts 360 having one or more errors identified to sub-layout identification tool 354 from layout verification and analysis tool 352. Sub-layout identification tool 354 for one embodiment may identify a sub-layout to comprise geometries within a minimum distance of an identified error. Sub-layout identification tool 354 for another embodiment may identify a sub-layout having an identified error to comprise one or more suitable logically severable portions of initial mask layout 330 to facilitate later replacement of a corrected sub-layout into initial mask layout 330. For one embodiment where initial mask layout 330 comprises data in GDS-II format, for example, sub-layout identification tool 354 may identify one or more structures and/or elements having an identified error.

For block 410 of FIG. 4, mask layout processing tool 320 separately processes one or more sub-layouts 360 to attempt to correct one or more errors in sub-layout(s) 360, producing processed sub-layout(s) 365. Mask layout processing tool 320 for one embodiment may process a sub-layout 360 under a different set of parameters to attempt to correct an error in the sub-layout 360. For one embodiment, mask layout processing tool 320 may automatically process a sub-layout 360 in a relatively finer manner to attempt to correct an error in the sub-layout 360. For another embodiment, layout verification and analysis tool 352 may analyze an error in a sub-layout 360 and identify to mask layout processing tool 320 how the sub-layout 360 is to be processed to attempt to correct the error.

Where mask layout processing tool 320 is to process one or more sub-layouts 360 using one or more corresponding original sub-layouts from input layout 310, for example to perform OPC on one or more sub-layouts 360, mask layout processing tool 320 for one embodiment may identify and either remove or copy from input layout 310 one or more sub-layouts based on layout position information stored in association with one or more corresponding sub-layouts 360. For another embodiment, sub-layout identification tool 354 may identify and either remove or copy from input layout 310 one or more sub-layouts corresponding to one or more sub-layouts 360 removed or copied from initial mask layout 330. Sub-layout identification tool 354 for one embodiment may store a sub-layout removed or copied from input layout 310 in association with its corresponding sub-layout 360 removed or copied from initial mask layout 330.

Referring to the examples of FIGS. 1 and 2, sub-layouts 111, 121, and 131 of layout 100 correspond to sub-layouts 211, 221, and 231, respectively, of mask layout 200 and may be identified and either removed or copied from layout 100 to process sub-layouts 211, 221, and 231, respectively.

Mask layout processing tool 320 may optionally store a processed sub-layout 365 in association with its corresponding sub-layout removed or copied from input layout 310.

Mask layout processing tool 320 for one embodiment may enable manual viewing and editing tool 326 to allow a user to manually view a sub-layout having an error and identify to mask layout processing tool 320 how the sub-layout is to be processed to attempt to correct the error, to identify to layout verification and analysis tool 352 to allow the error to remain in initial mask layout 330 without correction, or to attempt to correct the identified error manually. Because the amount of data defining a sub-layout is relatively small as compared to the amount of data to define all of initial mask layout 330, a file containing a sub-layout may be opened in reduced time for manual viewing and/or editing with reduced concern for system instability as compared to a file containing all of initial mask layout 330.

For block 412 of FIG. 4, layout verification tool 350 separately verifies one or more processed sub-layouts 365 to identify one or more errors. Layout verification tool 350 may verify one or more processed sub-layouts 365 in any suitable manner to identify any suitable one or more types of errors.

As illustrated in FIG. 3, layout verification and analysis tool 352 for one embodiment may verify one or more processed sub-layouts 365. Layout verification and analysis tool 352 for one embodiment may perform design rule checking (DRC) by verifying a processed sub-layout 365 against a set of manufacturing process rules to identify one or more suitable errors. In addition to or as an alternative to performing DRC, layout verification and analysis tool 352 for one embodiment may verify a simulated print of a processed sub-layout 365 against its corresponding sub-layout from input layout 310 to identify one or more suitable errors. For one embodiment, layout verification and analysis tool 352 may identify and either remove or copy from input layout 310 one or more sub-layouts based on layout position information stored in association with one or more corresponding processed sub-layouts 365. For another embodiment, layout verification and analysis tool 352 may receive a sub-layout previously removed or copied from input layout 310 by sub-layout identification tool 354 or mask layout processing tool 320 and stored in association with its corresponding sub-layout 360 and/or processed sub-layout 365.

Referring to the examples of FIGS. 1 and 2, sub-layouts 111, 121, and 131 of layout 100 correspond to sub-layouts 211, 221, and 231, respectively, of mask layout 200 and may be identified and either removed or copied from layout 100 to verify sub-layouts 211, 221, and 231, respectively.

By verifying a processed sub-layout 365, layout verification and analysis tool 352 identifies whether one or more identified errors in the processed sub-layout 365 have been corrected and/or whether any new errors have been generated in the processed sub-layout 365 in attempting to correct a previously identified error.

Because the processing of a sub-layout having an error may potentially affect other areas of initial mask layout 330, sub-layout identification tool 354 for one embodiment may identify and either remove or copy from initial mask layout 330 one or more larger sub-layouts 360 having one or more errors. Mask layout processing tool 320 for one embodiment may then process a larger sub-layout 360 to produce a larger processed sub-layout 365 by processing only a smaller sub-layout having one or more errors within the larger sub-layout 360. Layout verification and analysis tool 352 may then verify the larger processed sub-layout 365 which includes the smaller processed sub-layout. Mask layout processing tool 320 for one embodiment may identify that only a smaller sub-layout of a larger sub-layout 360 is to be processed, for example, in response to control information received from layout verification and analysis tool 352 or stored in association with the larger sub-layout 360.

Referring to the examples of FIGS. 1 and 2, sub-layout identification tool 354 may identify and either remove or copy larger sub-layouts 212, 222, and 232 from mask layout 200. Mask layout processing tool 320 may then process smaller sub-layouts 211, 221, and 231 within larger sub-layouts 212, 222, and 232, respectively. Layout verification and analysis tool 352 may then verify the larger sub-layouts 212, 222, and 232, which include the smaller processed sub-layouts 211, 221, and 231, respectively, against corresponding larger sub-layouts 112, 122, and 132, respectively, from layout 100.

If any errors are identified in processed sub-layout(s) 365 and are to be corrected, noting for one embodiment that an error may be identified by manual viewing and editing tool 326 as to remain in initial mask layout 330 without correction, as identified for block 414 of FIG. 4, mask layout processing tool 320 for block 410 separately reprocesses one or more sub-layouts 365 having an identified error to be corrected and for block 412 separately verifies one or more sub-layouts 365 just processed for block 410.

Mask layout processing tool 320 and layout verification tool 350 may iteratively continue separately processing sub-layout(s) 365 having an identified error to be corrected and separately verifying such processed sub-layout(s) 365 until layout verification tool 350 identifies for block 414 that processed sub-layout(s) 365 do not have any errors to be corrected.

For block 416 of FIG. 4, layout verification tool 350 merges one or more processed sub-layouts 365 into initial mask layout 330 to generate a mask layout 370. Layout verification tool 350 may merge one or more processed sub-layouts 365 into initial mask layout 330 in any suitable manner. As illustrated in FIG. 3, layout verification tool 350 for one embodiment may comprise a layout merging tool 356 to merge one or more processed sub-layouts 365 into initial mask layout 330.

Layout merging tool 356 for one embodiment may merge a processed sub-layout 365 into initial mask layout 330 by replacing a corresponding sub-layout 360 having one or more errors in initial mask layout 330 with the processed sub-layout 365. For one embodiment where a sub-layout 360 having one or more errors has been removed from initial mask layout 330 for error correction processing and verification, layout merging tool 356 may insert a corresponding processed sub-layout 365 into initial mask layout 330. For one embodiment where a sub-layout 360 having one or more errors has been copied from initial mask layout 330 for error correction processing and verification, layout merging tool 356 may replace the sub-layout 360 in initial mask layout 330 with a corresponding processed sub-layout 365.

Layout merging tool 356 for another embodiment may merge a processed sub-layout 365 into initial mask layout 330 by identifying one or more differences between a corresponding sub-layout 360 having one or more errors in initial mask layout 330 and the processed sub-layout 365 and modifying the sub-layout 360 in initial mask layout 330 with the identified difference(s).

For block 418 of FIG. 4, layout verification tool 350 outputs mask layout 370.

Because the amount of data defining a sub-layout is relatively small as compared to the amount of data to define all of mask layout 370, the time to design and verify mask layout 370 is reduced because only one or more sub-layouts are processed for error correction and verified over one or more iterations following the processing and verification of initial mask layout 330.

For another embodiment, prior to outputting mask layout 370, layout verification tool 350 for block 404 may verify mask layout 370 to help ensure mask layout 370 may be used to help print the target pattern defined by input layout 310 adequately. Mask layout processing tool 320 and layout verification tool 350 may iteratively continue performing operations for blocks 404–416 until layout verification tool 350 identifies for block 406 that mask layout 370 does not have any errors to be corrected. Layout verification tool 350 may then output mask layout 370 for block 418.

Rather than verifying processed sub-layout(s) 365 prior to merging processed sub-layout(s) 365 into initial mask layout 330, system 300 for another embodiment may merge one or more processed sub-layouts 365 into initial mask layout 330 and then separately verify potentially affected areas of initial mask layout 330 to identify one or more errors. System 300 for one embodiment may incrementally design and verify a mask layout in this manner in accordance with a flow diagram 500 of FIG. 5.

The description of flow diagram 400 not inconsistent with the description of flow diagram 500 similarly applies to flow diagram 500.

Figure 5:
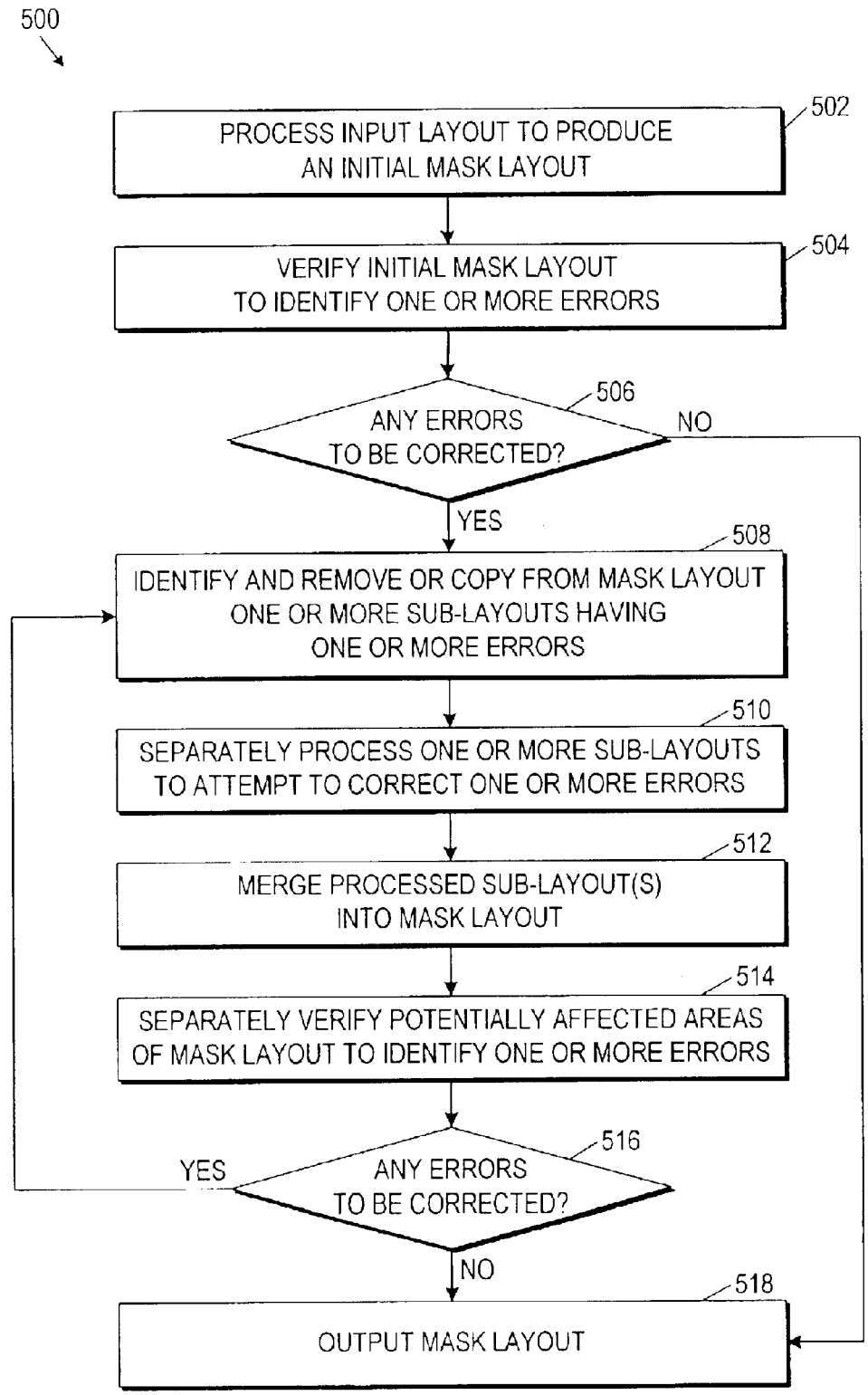
FIG. 5 illustrates, for another embodiment, a flow diagram to design and verify a lithography mask layout in an incremental manner.

For block 502 of FIG. 5, mask layout processing tool 320 processes an input layout 310 to produce an initial mask layout 330 similarly as for block 402 of FIG. 4.

For block 504 of FIG. 5, layout verification tool 350 verifies initial mask layout 330 to identify one or more errors similarly as for block 404 of FIG. 4.

If any errors are identified in initial mask layout 330, as identified for block 506 of FIG. 5, layout verification tool 350 for block 508 identifies and either removes or copies from initial mask layout 330 one or more sub-layouts 360 having one or more identified errors similarly as for block 408 of FIG. 4.

For block 510 of FIG. 5, mask layout processing tool 320 separately processes one or more sub-layouts 360 to attempt to correct one or more errors in sub-layout(s) 360 similarly as for block 410 of FIG. 4, producing processed sub-layout (s) 365.

For block 512 of FIG. 5, layout verification tool 350 merges one or more processed sub-layouts 365 into initial mask layout 330 to produce mask layout 370 similarly as for block 416 of FIG. 4.

For block 514 of FIG. 5, layout verification tool 350 separately verifies potentially affected areas of mask layout 370 to identify one or more errors. Layout verification tool 350 may identify potentially affected areas of mask layout 370 in any suitable manner. Layout verification tool 350 for one embodiment may identify one or more merged processed sub-layouts 365 as potentially affected area(s) of mask layout 370. Layout verification tool 350 for another embodiment may identify in mask layout 370 one or more suitable larger sub-layouts containing a merged processed sub-layout 365 as potentially affected area(s) of mask layout 370. Referring to the example of FIG. 2 where sub-layouts 211, 221, and 231 of mask layout 200 are merged processed sub-layouts, layout verification tool 350 may identify sub-layouts 212, 222, and 232 as potentially affected areas of mask layout 200. Layout verification tool 350 may verify identified potentially affected areas of mask layout 370 similarly as for block 412 of FIG. 4.

If any errors are identified in mask layout 370 and are to be corrected, noting for one embodiment that an error may be identified by manual viewing and editing tool 326 as to remain in mask layout 370 without correction, as identified for block 516 of FIG. 5, layout verification tool 350 identifies and either removes or copies from mask layout 370 one or more sub-layouts 360 having one or more identified errors for block 508. Mask layout processing tool 320 then processes one or more sub-layouts 360 for block 510. Layout verification tool 350 then merges one or more processed sub-layouts 365 into mask layout 370 for block 512 and verifies potentially affected areas of mask layout 370 to identify one or more errors for block 514. Layout verification tool 350 and mask layout processing tool 320 may iteratively continue performing operations for blocks 508–516 in this manner until layout verification tool 350 identifies for block 516 that identified potentially affected areas of mask layout 370 do not have any errors to be corrected.

For block 518 of FIG. 5, layout verification tool 350 outputs mask layout 370.

Mask layout processing tool 320 and layout verification tool 350 may perform operations for flow diagrams 400 and 500 in any suitable order and may or may not overlap in time the performance of any suitable operation with any other suitable operation. System 300 for one embodiment may, for example, perform operations for blocks 408–416 of FIG. 4 and/or operations for blocks 508–516 in a pipelined manner.

Mask layout processing tool 320 and layout verification tool 350 for one embodiment may be implemented by executing suitable instructions by one or more processors of a computer system. Such instructions may be stored on any suitable computer-readable medium from which the instructions may be transmitted to the computer system. As used in this description, suitable computer-readable media include, without limitation, a hard disk device, an optical disk device such as a compact disc (CD) or digital versatile disc (DVD) device for example, a Bernoulli disk device such as a Jaz or Zip disk device for example, a flash memory device, a file server, and/or any other suitable memory device. The computer system may receive instructions from a suitable computer-readable medium that is a part of the computer system and/or from a suitable computer-readable medium external to the computer system at a local or remote location. The computer system may store any data, such as a process model or layout for example, on a suitable machine-readable medium that is a part of the computer system and/or on a suitable machine-readable medium external to the computer system at a local or remote location.

Example Use of Mask Layout

A lithography mask layout that has been designed and verified incrementally from an input layout defining a target pattern may be used for any suitable purpose to print the target pattern.

Figure 6:
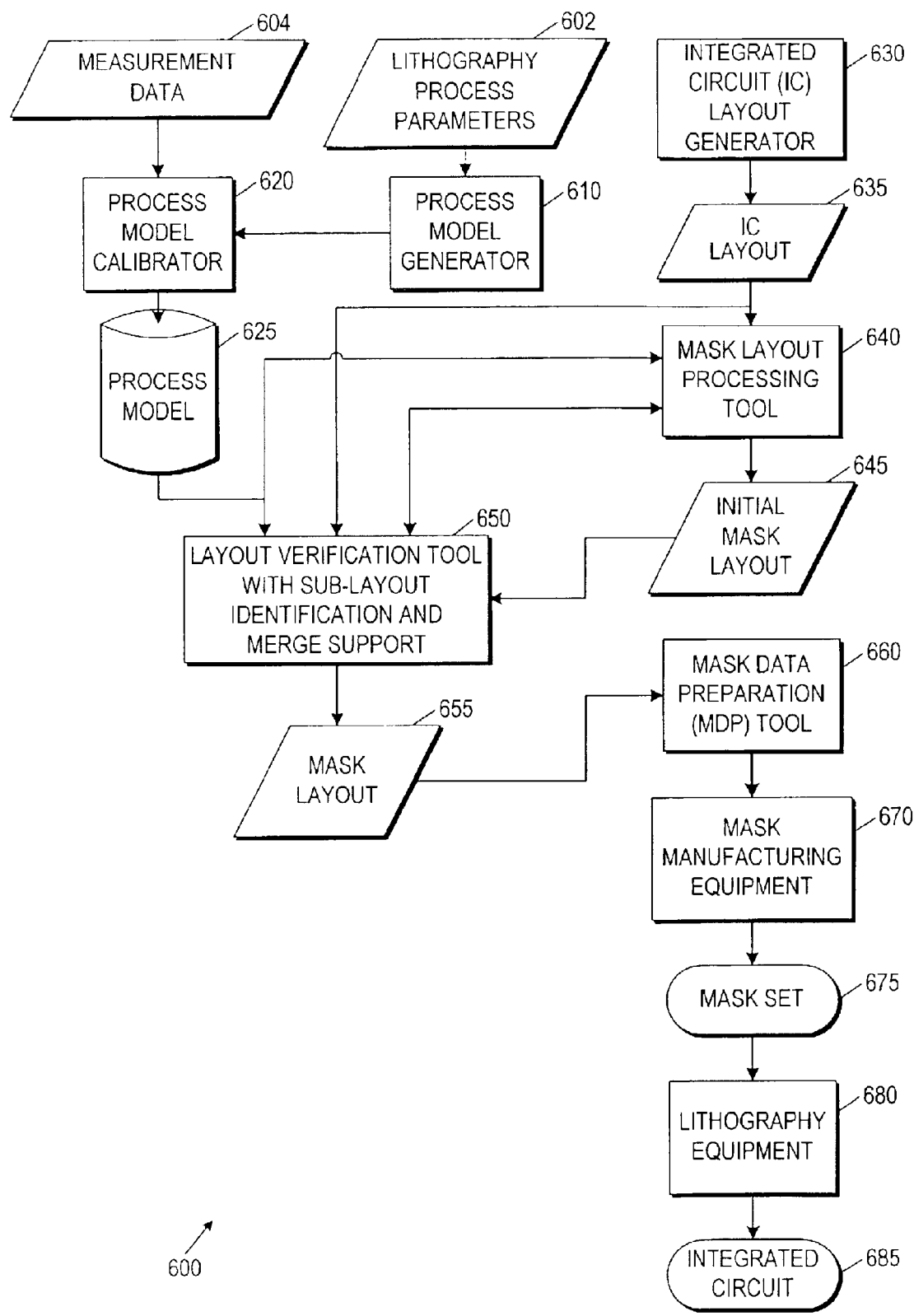
FIG. 6 illustrates, for one embodiment, a system to manufacture an integrated circuit (IC) using a lithography mask set manufactured in accordance with a mask layout incrementally designed and verified.

FIG. 6 illustrates, for one embodiment, a system 600 to help manufacture an integrated circuit (IC) 685 using a mask layout 655 that has been incrementally designed and verified. As illustrated in FIG. 6, system 600 comprises a process model generator 610, a process model calibrator 620, an integrated circuit layout generator 630, a mask layout processing tool 640, a layout verification tool 650 with sub-layout identification and merge support, a mask data preparation (MDP) tool 660, mask manufacturing equipment 670, and lithography equipment 680.

Process model generator 610 generates a preliminary process model based on a predetermined set of lithography process parameters 602 to be used to print a target pattern in manufacturing IC 685. Process model calibrator 620 calibrates the preliminary process model based on measurement data 604 to generate a process model 625 that accounts for optical and/or chemical effects not captured by the preliminary process model. Measurement data 604 is generated from measurements of test patterns printed using the predetermined set of lithography process parameters 602. Process model 625 generally corresponds to process model 340 of FIG. 3.

IC layout generator 630 generates an IC layout 635 for one or more layers of IC 685. Mask layout processing tool 640 processes IC layout 635 to produce an initial mask layout 645, and layout verification tool 650 verifies initial mask layout 645 to identify one or more errors in initial mask layout 645. Layout verification tool 650 then identifies and either removes or copies one or more sub-layouts having one or more identified errors from initial mask layout 645 for separate error correction processing by mask layout processing tool 640 and verification by layout verification tool 650 to generate mask layout 655. IC layout 635, mask layout processing tool 640, initial mask layout 645, layout verification tool 650, and mask layout 655 generally correspond to input layout 310, mask layout processing tool 320, initial mask layout 330, layout verification tool 350, and mask layout 370 of FIG. 3.

Mask data preparation (MDP) tool 660 generates mask data based on mask layout 655, and mask manufacturing equipment 670 manufactures one or more masks in a mask set 675 based on the generated mask data. Lithography equipment 680 is used to help print the target pattern defined by IC layout 635 in a corresponding layer of IC 685 using mask set 675. IC 685 is manufactured by printing the target pattern defined by a corresponding IC layout for one or more layers of IC 685.

For one embodiment, process model generator 610, process model calibrator 620, IC layout generator 630, mask layout processing tool 640, layout verification tool 650, and MDP tool 660 may each be implemented in whole or in part by executing suitable instructions by one or more processors of a computer system. Such instructions may be stored on any suitable machine-readable medium from which the instructions may be transmitted to the computer system. The computer system may receive instructions from a suitable machine-readable medium that is a part of the computer system and/or from a suitable machine-readable medium external to the computer system at a local or remote location. The computer system may store any data, such as a process model or layout for example, on a suitable machine-readable medium that is a part of the computer system and/or on a suitable machine-readable medium external to the computer system at a local or remote location.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:

identifying an error in a mask layout;

identifying in the mask layout a sub-layout having the error;

performing at least one of removing and copying the sub-layout from the mask layout;

applying error-correction processing for the error to the sub-layout to generate a processed sub-layout; and merging the processed sub-layout into the mask layout.

2. The method of claim 1, comprising verifying the processed sub-layout prior to merging the processed sub-layout into the mask layout.

3. The method of claim 1, wherein applying error-correction processing comprises processing only a portion of the identified sub-layout.

4. The method of claim 1, comprising verifying the processed sub-layout after merging the processed sub-layout into the mask layout.

5. The method of claim 4, wherein verifying the processed sub-layout comprises:

selecting a portion of the mask layout that includes the processed sub-layout; and verifying the portion of the mask layout.

6. A computer-readable medium having instructions which, when executed by a computer system, cause the computer system to perform a method comprising:

identifying an error in a mask layout;

identifying in the mask layout a sub-layout having the error;

performing at least one of removing and copying the sub-layout from the mask layout;

applying error-correction processing for the error to the sub-layout to generate a processed sub-layout; and merging the processed sub-layout into the mask layout.

7. The computer-readable medium of claim 6, wherein the method comprises verifying the processed sub-layout prior to merging the processed sub-layout into the mask layout.

8. The computer-readable medium of claim 6, wherein applying error-correction processing to the sub-layout comprises processing only a portion of the identified sub-layout.

9. The computer-readable medium of claim 6, wherein the method comprises verifying the processed sub-layout after merging the processed sub-layout into the mask layout.

10. The computer-readable medium of claim 9, wherein verifying the processed sub-layout comprises:

selecting a portion of the mask layout that includes the processed sub-layout; and verifying the portion of the mask layout.

11. A computer-readable medium having instructions which, when executed by a computer system, cause the computer system to perform a method comprising:

verifying a mask layout to identify one or more errors in the mask layout;

identifying in the mask layout one or more sub-layouts having one or more errors;

performing at least one of removing and copying the one or more sub-layouts from the mask layout;

applying error-correction processing for the one or more errors to the one or more sub-layouts to generate one or more processed sub-layouts;

verifying the one or more processed sub-layouts; and merging the one or more processed sub-layouts into the mask layout.

12. The computer-readable medium of claim 11, wherein the processing comprises processing only a portion of each of the one or more sub-layouts.

13. The computer-readable medium of claim 11, wherein the method further comprises verifying a portion of the mask layout comprising the one or more processed sub-layouts.

14. An apparatus comprising:

a layout verification tool to identify an error in a mask layout;

a sub-layout identification tool to identify in the mask layout a sub-layout having the error and to perform at least one of removing and copying the sub-layout from the mask layout; and a layout merging tool f or merging a processed sub-layout into the mask layout, the processed sub-layout being generated by applying error-correction processing for the error to the sub-layout.

15. The apparatus of claim 14, wherein the layout verification tool can verify the processed sub-layout prior to the layout merging tool merging the processed sub-layout into the mask layout.

16. The apparatus of claim 14, wherein the layout verification tool can verify the processed sub-layout subsequent to the layout merging tool merging the processed sub-layout into the mask layout.

17. The apparatus of claim 16, wherein the layout verification tool can verify a selected portion of the mask layout comprising the merged sub-layout.

18. An apparatus comprising:

a mask layout processing tool for processing an input layout to produce a mask layout and for applying error-correction processing for one or more errors to one or more sub-layouts to generate one or more processed sub-layouts;

a layout verification tool for identifying the one or more sub-layouts from the mask layout, each of the one or more sub-layouts including at least one of the one or more errors, for performing at least one of removing and copying the one or more sub-layouts from the mask layout, and for verifying the one or more processed sub-layouts; and a layout merging tool for merging the one or more processed sub-layouts into the mask layout to generate a processed mask layout.

19. The apparatus of claim 18, wherein the mask layout processing tool applies the error-correction process to a portion of each of the one or more identified sub-layouts.

20. The apparatus of claim 18, wherein verifying the one or more processed sub-layouts comprises verifying one or more portions of the processed mask layout, the one or more portions of the processed mask layout comprising the one or more processed sub-layouts.

21. An apparatus comprising:

means for identifying in a mask layout a sub-layout having an error;

means for performing at least one of removing and copying the sub-layout from the mask layout; and means for merging a processed sub-layout into the mask layout, the processed sub-layer being generated by applying error-correction processing for the error to the sub-layout.

22. The apparatus of claim 21, comprising means for applying error-correction processing to the sub-layout to generate the processed sub-layout.

23. The apparatus of claim 21, comprising means for verifying the processed sub-layout.

\* \* \* \* \*